United States Patent [19]

Lundstrom

[11] Patent Number: 4,575,229
[45] Date of Patent: Mar. 11, 1986

[54] PHOTOETCH PLATE HINGE

[75] Inventor: Inge Lundstrom, Gilroy, Calif.

[73] Assignee: Koltron Corporation, Sunnyvale, Calif.

[21] Appl. No.: 606,512

[22] Filed: May 3, 1984

[51] Int. Cl.[4] .............................................. G03B 27/58
[52] U.S. Cl. ...................................... 355/72; 355/89; 355/122
[58] Field of Search ................. 355/126, 114, 127, 89, 355/79, 74, 132, 91, 75, 93, 125, 133, 72, 128, 129, 130, 78, 122

[56] References Cited

U.S. PATENT DOCUMENTS

| 799,401 | 9/1905 | Petrie | 355/129 |
| 4,412,739 | 11/1983 | Freiberg | 355/89 |
| 4,445,775 | 5/1984 | Tongel | 355/122 |

Primary Examiner—L. T. Hix
Assistant Examiner—Brian W. Brown
Attorney, Agent, or Firm—Thomas E. Schatzel

[57] ABSTRACT

A photoetch plate hinge apparatus having a base photoetch plate for supporting a base hinge platform to which a metal hinge is mounted. The metal hinge is also secured to a coverplate hinge platform which is affixed to a cover photoetch plate via a cantilever bridge structure. The cover plate hinge platform and the cover photoetch plate are capable of vertical arc-like movement relative to the base photoetch plate, so as to accomplish the disposition of sheet material between the base and cover plates for photoetching. The usable surfaces of the plates are totally accessible to irradiation and cleaning, and will not damage when subjected to vacuum photoetching procedures.

13 Claims, 6 Drawing Figures

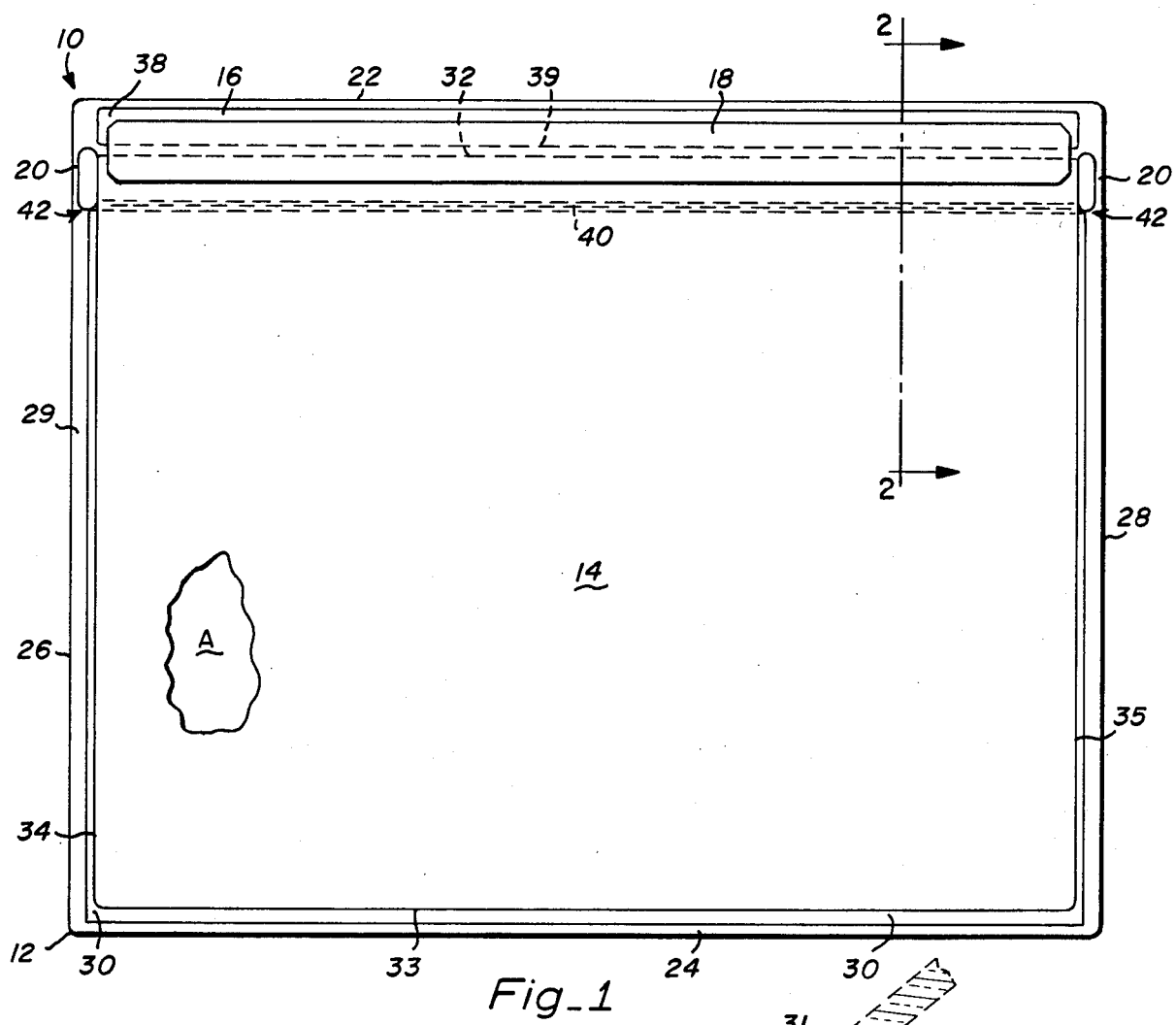
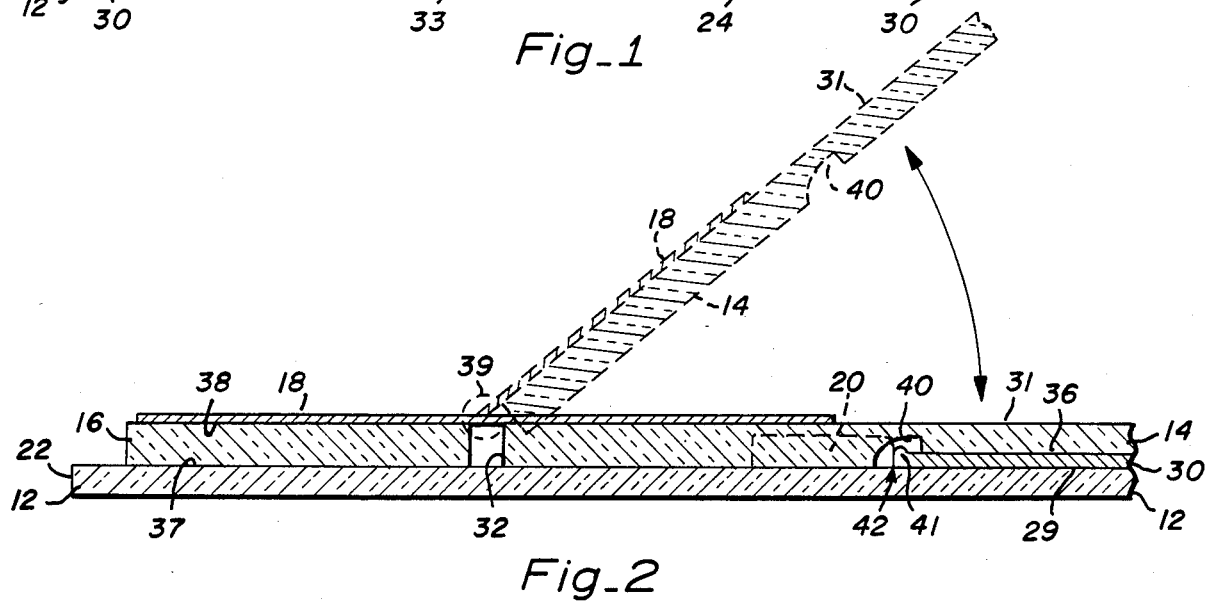

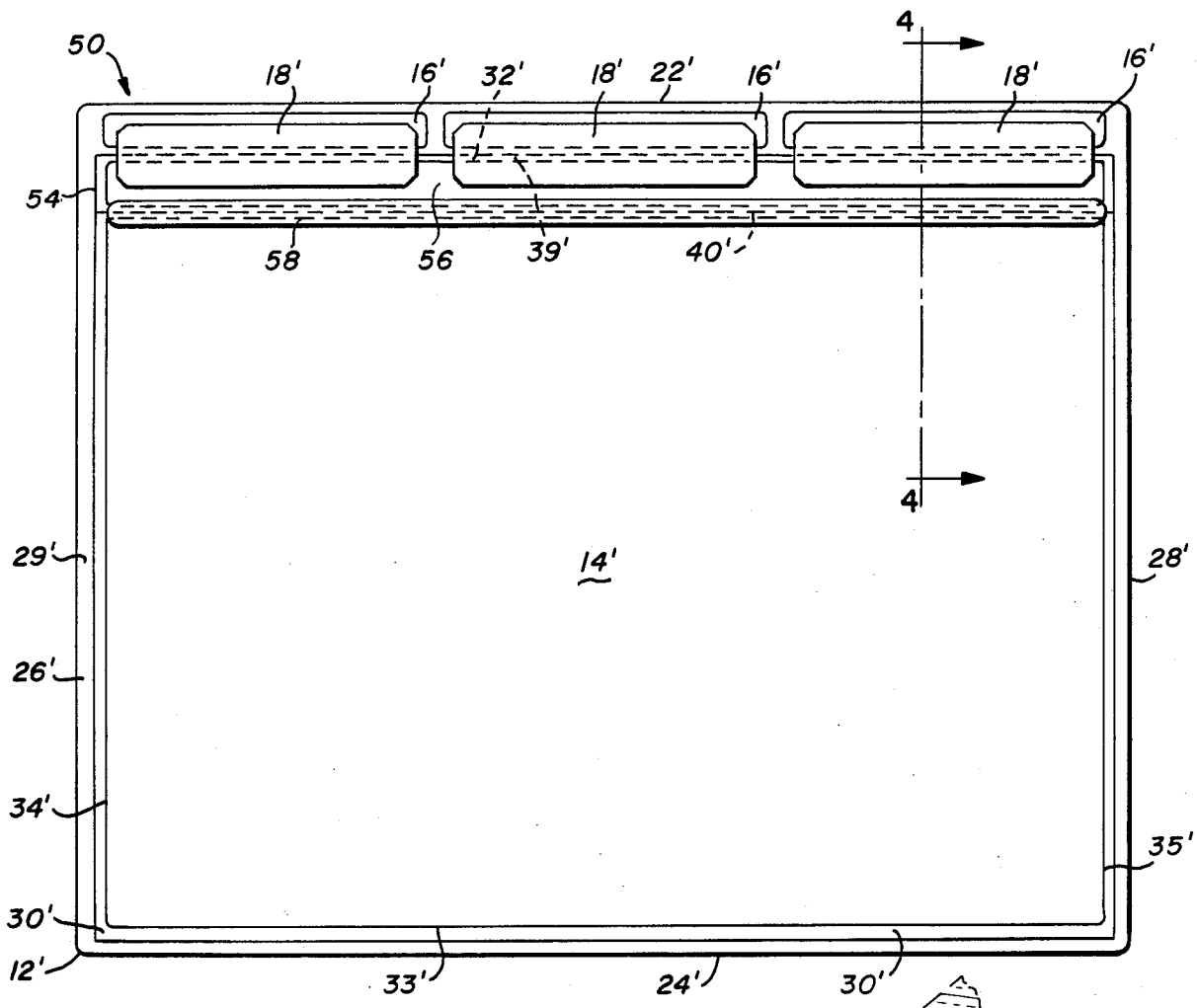
Fig_3
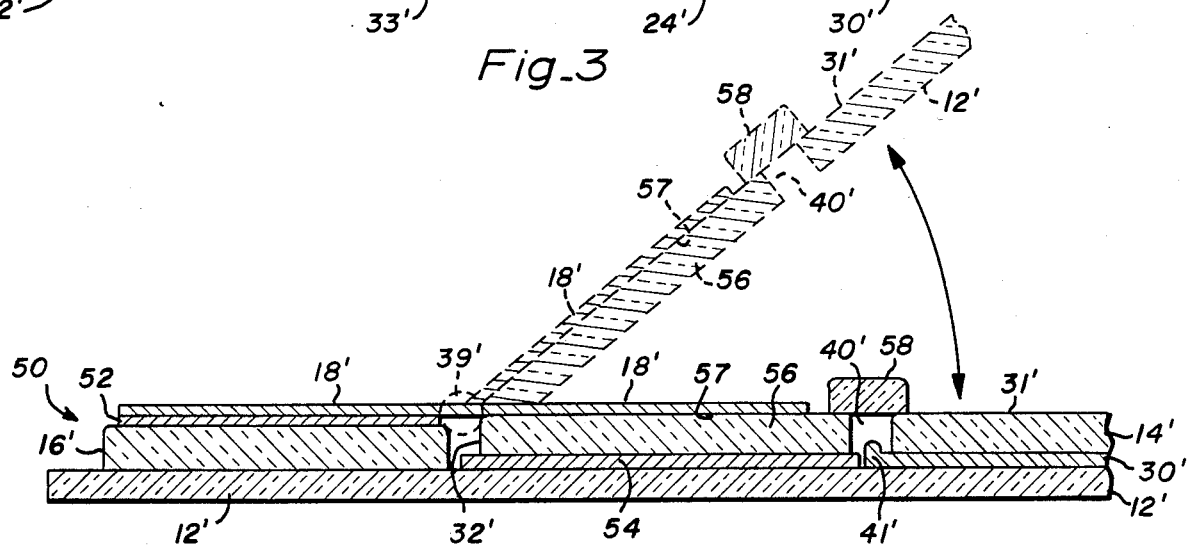
Fig_4

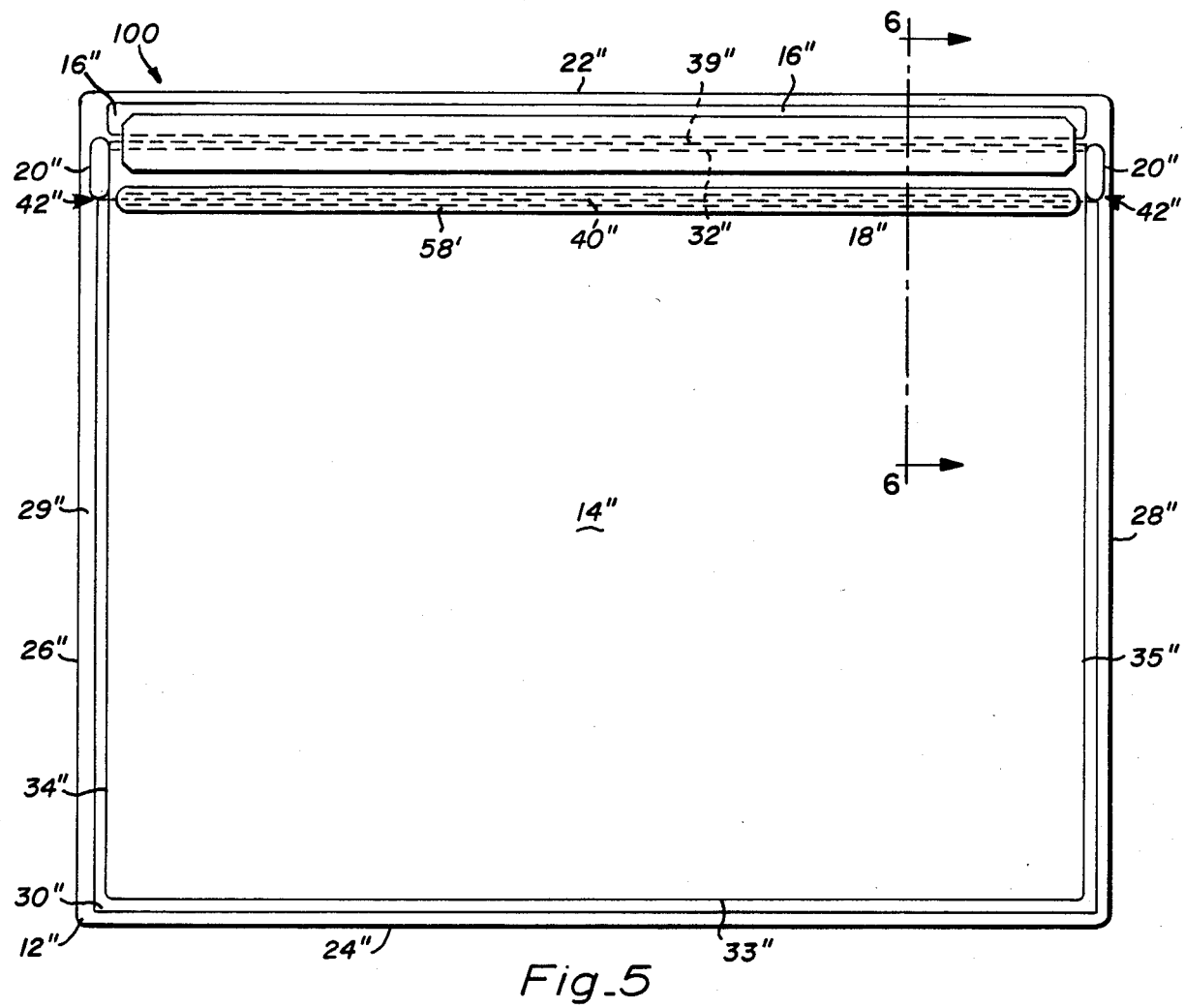
Fig_5
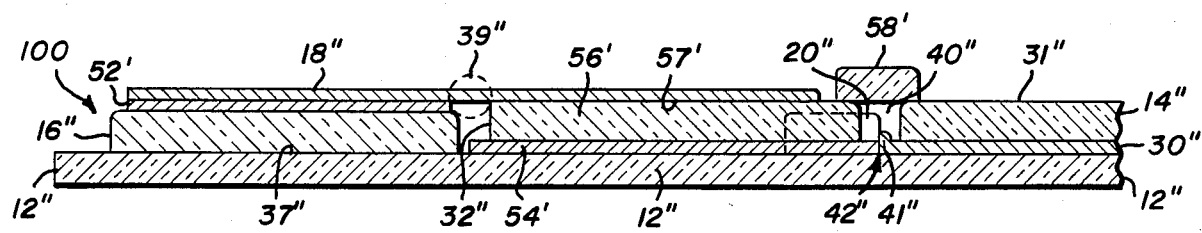
Fig_6

PHOTOETCH PLATE HINGE

BACKGROUND OF THE INVENTION

1. Field of the Invention

The present invention relates to photoetch plates and more particularly to a photoetch plate hinge for securely positioning two photoetch plates about a sheet of material.

2. Description of the Prior Art

Photoetch plates are used to create intricate metal structures. Such metal structures include lead frames which are commonly used to electrically connect integrated circuit chips to discreet electrical componentry. The creation of such structures via photoetching requires the disposition of a metal sheet between two photographic plates. The plates are typically glass onto which a desired design or mask pattern has been recorded. The metal sheet has a radiation sensitive coating of "resolve" on the side to be etched. Upon exposure to radiation, the resolve coating undergoes a molecular change.

The metal sheet and the photographic plates are placed in a vacuum device and a radiation source such as a high intensity ultraviolet light is passed about the sandwiched structure. The vacuum device is used to compress the plates against the metal sheet to ensure high resolution irradiation. The sheet is then removed from the photo plate sandwich and processed further to create the lead frames.

Time is consumed in the proper placement and removal of the sheet from between the photo plates. Proper registration or alignment of the photo plates and the sheet is critical to prevent waste. Improper registration of any plate or sheet by greater than two ten thousandths (0.0002) of an inch results in one side of the metal sheet being irradiated in improper alignment with the other side when both sides of the plate are irradiated. This results in low quality or waste sheets.

To speed up the placement of the metal sheet between the photo plates, and to ensure proper registration of the plates and the sheet, the photo plates are hinged together. Use of hinged photoetch plates is known in the prior art. The prior art discloses the use of a flexible plastic hinge secured to one end of each photo plate. A glass protective shield is flexibly secured to the hinge. The sheet material is disposed between the two plates by lifting the top plate from the bottom plate in a vertical arc-like manner and inserting the sheet. The plastic hinge functions as a fulcrum. Once the sheet is inserted between the plates the top plate is lowered over the sheet. The prior art also utilizes a burr channel. A burr channel is a small cavity created in one of the plates to prevent burrs on the edge of the metal sheet from cracking the photo plates when such are placed in a vacuum. Furthermore, the burr channel is necessary to allow excess resolve or resolve that has beaded up on the edge of the metal from interfering with the etching process. There are numerous disadvantages with the prior art.

One disadvantage of the prior art is its use of a plastic hinge. Plastic hinges do not have the same coefficient of expansion as glass photoetch plates resulting in a loss of registration between the plates and/or the sheet when high temperature radiation lamps are used to irradiate the sheet.

Another disadvantage of the prior art is its use of a glass protective shield over the plastic hinge to prevent loss of registration due to hinge deformation caused by the vacuum pressure during irradiation. Use of such a glass protective plate is expensive and contributes to photoetch processing costs.

Another disadvantage of the prior art is that glue used to adhere the plastic hinge to the plates migrates into the burr channel and contacts the metal sheet. When the metal sheet is removed, the glue smears on the sheet or the photoetch plates fouling the plates and/or destroying the irradiated surface of the sheet.

A further disadvantage of the prior art is that once glue contacts the metal sheet or the plates it induces uneven stress on the plates resulting in cracking or breakage of the photo plates when such are subjected to vacuum pressure.

Another disadvantage of the prior art is that the photo plates are not totally accessible for cleaning. Removal of surface impurities or glue from the photo plates is impossible in the portion of the plate closest to the hinge. This prevents the removal of undesirable foreign particulate matter from the plates thereby reducing the effective usable life of the plates.

SUMMARY OF THE PRESENT INVENTION

It is therefore an object of the present invention to provide a photoetch plate hinge that is more economical to manufacture.

It is another object of the present invention to provide a photoetch plate hinge that is less time intensive to utilize.

It is a further object of the present invention to provide a photoetch plate hinge having the same coefficient of expansion as the photoetch plates to prevent loss of registration between the plates and/or the sheet when the plates are heated.

It is also another object of the present invention to provide a photoetch plate hinge that does not require the use of protective shields to prevent hinge deformation when the hinge is subjected to vacuum pressures.

It is also another object of the present invention to provide a photoetch plate hinge that prevents hinge glue from migrating into the burr channel.

It is furthermore an object of the present invention to provide a photoetch plate hinge that allows the photoetch plates to be fully cleaned.

Briefly, a preferred embodiment includes a cover photoetch plate, a base photoetch plate, a hinge platform, a flexible metal hinge and an alignment stopper. The base and cover photoetch plates are rectangular in shape with the base plate being wider and longer than the cover plate. The base and cover plates may have preselected mask patterns recorded thereon. The patterns are opaque to ultraviolet radiation. The hinge platform is secured to one end portion of the base plate and forms a mounting structure for a portion of the metal hinge. The metal hinge is secured to the hinge platform and to a portion of the cover plate.

When assembled a metal sheet coated with a resolve coating can be disposed between the base and cover plate by lifting the cover plate above the base plate in a vertical arc-like manner and placing the sheet on the base plate. The sheet will come to rest against the alignment stopper positioned at the hinge base portion of the base plate. Once the sheet is so positioned the cover plate is lowered onto the sheet. When the sheet is between the plates it is supported by the base plate while the sheet supports the greatest portion of the cover plate.

Located above the leading edge of the sheet in the cover plate is a burr channel. The burr channel is a downward facing cavity defined by the cover plate. The burr cavity encloses the leading edge of the sheet to prevent raised sheet edges from damaging the plates when such are subjected to vacuum pressure. The alignment stopper is located so as to position the leading edge of the sheet within the burr channel.

The cover plate and metal hinge are aligned so that the total area of the sheet under the cover plate can be exposed to ultraviolet radiation to effect irradiation of the total sheet. The metal hinge has the same coefficient of expansion as the photoetch plates An advantage of the present invention is that it allows the use of a metal hinge having the same coefficient of expansion as the photo plates thereby eliminating registration changes between the hinge and the plates while exposing the sheet to radiation.

Another advantage of the present invention is that hinge glue is prevented from entering the burr channel thereby preventing breakage of the photoetch plate due to glue migration.

Another advantage of the present invention is the elimination of the need for use of a protective glass shield over the hinge to prevent vacuum pressure induced hinge deformation.

Another advantage of the present invention is that both base and cover photoetch plates are accessible for total cleaning.

A further advantage of the present invention is that it provides for quick placement and alignment of the sheet between the plates.

These and other objects and advantages of the present invention will no doubt become obvious to those of ordinary skill in the art after having read the following detailed description of the preferred embodiments which are illustrated in the various drawing figures.

IN THE DRAWING

FIG. 1 llustrates a photoetch plate hinge in cooperation with photo etch plates according to the present invention;

FIG. 2 is an enlarged fragmented cross-sectional view of the photoetch plate hinge taken along line 2—2 of FIG. 1;

FIG. 3 illustrates a first alternative embodiment of the present invention;

FIG. 4 illustrates an enlarged fragmented cross-sectional view of the first alternative embodiment taken along line 4—4 of FIG. 3;

FIG. 5 illustrates a second alternative embodiment of the present invention; and FIG. 6 illustrates an enlarged fragmented cross-sectional view of the second alternative embodiment taken along line 6—6 of FIG. 5.

DETAILED DESCRIPTION OF THE PREFERRED EMBODIMENT

Referring to FIGS. 1 and 2 there is shown a photoetch plate hinge referred to by general reference character 10. Plate hinge 10 includes a rectangular glass base photoetch plate 12, a rectangular glass cover photoetch plate 14, a rectangular glass hinge base 16, a flexible metal hinge 18, and two glass alignment stoppers 20. Base plate 12 has an upper edge 22, a lower edge 24, a left side edge 26, a right side edge 28 and a top planar surface 29. Base plate 12 is capable of supporting a metal sheet 30 about its top surface 29. Metal sheet 30 is coated on both sides with a coating of ultraviolet sensitive resolve (not shown). Cover sheet 14 has an upper planar surface 31, an upper edge 32, a lower edge 33, a left side edge, a right side edge 35, and a lower planar surface 36.

Base plate 12 and cover plate 14 have preselected mask patterns, illustrated by the symbol A recorded on their planar surfaces 29 and 36, respectively. The masks are symetrical, if both sides of sheet 30 are to be etched, and are opaque to select radiation, such as ultraviolet radiation. When sheet 30 is sandwiched between base plate 12 and cover plate 14 as shown in FIGS. 1 and 2 and irradiated by an ultraviolet radiation source (not shown), the radiation passes through the non-mask portions of base and cover plates 12 and 14 and strikes sheet 30. Portions of sheet 30 covered by the mask pattern are not exposed to the radiatio which thereby prevents the resolve coatings on sheet 30 from changing their molecular structure.

Glass hinge base 16 is placed near the upper edge 22 portion of base plate 12. A lower planar surface 37 of hinge base 16 is secured to the upper surface 29 of base plate 12. Conventional adhesives, such as epoxy resins, may be utilized to affect the adhesion.

Hinge base 16 has an upper planar surface 38 and metal hinge 18 is secured to hinge base 16 about surface 38 as shown. Hinge 18 is also secured to the upper surface 31 of cover plate 14. Again conventional adhesives can be used to bond hinge 18 to hinge base 16 and cover plate 14. Hinge 18 allows cover plate 14 to be lifted, in a vertical arc-like manner, away from base plate 12 as shown in FIG. 2. Hinge 18 acts as a fulcrum 39 about which cover plate 14 pivots. Hinge 18 is 0.005 inches thick.

Cover plate 14 and hinge base 16 are of a predetermined thickness so that when sheet 30 is disposed between plates 12 and 14, hinge 18 and cover plate 14 are substantially parallel to base plate 12. Use of such a configuration prevents damage to plates 12 or 14 when plate hinge 10 is subjected to vacuum pressure. Typically, photo hinge 10 is subjected to vacuum pressures in excess of twenty pounds per square inch.

Cover plate 14 also defines a burr channel 40. Burr channel 40 is designed to enclose any raised edges or burrs 41 located on the leading edge of metal sheet 30. Hinge 18 is positioned away from burr channel 40 so that it does not interfere with irradiation of metal sheet 30. In this way the total surface area of metal sheet 30 is available for exposure to radiation.

Located on either side of cover plate 14 at the upper ends 32 and on base plate 12 are the alignment stoppers 20. Stoppers 20 are secured to base plate 12 and are positioned so as to properly align sheet 30 between plates 12 and 14. Stoppers 20 ensure that burr 41 is enclosed by burr channel 40. Stoppers 20 intersect with sheet 30 at a stopper-sheet intersection 42.

The plate hinge 10 is capable of withstanding vacuum pressure in excess of twenty pounds per square inch (PSI) without altering plate-to-plate or plate-to-sheet registration. Furthermore, the total usable surfaces of base plate 12 and cover plate 14 are accessible for easy cleaning without dismanteling plate hinge 10.

Hinge 18 is selected to have the same coefficient of expansion as cover plate 14 and base plate 12 so that plate-to-plate or plate-to-sheet registration is maintained when hinge 18 is heated during irradiation of sheet 30.

Base plate 12, cover plate 14 and sheet 30 are rectangular. Base plate 12 is longer and wider than sheet 30 and cover plate 14. Sheet 30 is longer and wider than cover plate 14. When sheet 30 is sandwiched between base plate 12 and cover plate 14 it extends beyond the left side edge 34, the right side edge 35 and the lower edge 33 of cover plate 14.

A second alternative embodiment of a plate hinge of the present invention is illustrated in FIGS. 3 and 4, and is referred to by general reference character 50. Components of FIGS. 3 and 4 similar to components shown in FIGS. 1 and 2 carry the same reference number distinguished by a prime designation. Photoetch plate hinge 50 utilizes a segmented three piece flexible hinge 18' and a segmented three piece hinge base 16'. In certain applications, the segmented hinge 18' may provide for reduced manufacture time of plate hinge 50 and to alleviate vacuum induced stress on hinge 18'. Plate hinge 50 is easier to manufacture with segmented hinge 18' as less precision is required in the locating of hinge 18' on the hinge base 16'. Stress relief of hinge 18' is accomplished as segmented hinge 18' is free to flex, due to its segmentation, when plate hinge 50 is subjected to vacuum pressures, thereby eliminating damage to hinge 18'.

Plate hinge 50 also includes a hinge base shim 52, a cover plate hinge base shim 54, a cover plate hinge base 56 with a top planar surface 57 and a glass cantilever bridge 58. Hinge base shim 52 is fixedly attached to hinge base 16' and supports and is attached to hinge 18'. Cover plate hinge base shim 54 is fixedly attached to base plate 12'. Cover plate hinge base 54 supports, without being attached to, cover plate hinge base 56. Shims 52 and 54 are the same thickness and are utilized to increase or decrease the thickness of hinge 50, so as to maintain a parallel planar relationship between cover plate top planar surface 31 and base plate top planar surface 37' independent of the thickness of sheet 30. Such a planar relationship prevents damage to plate hinge 50 when it is subjected to vacuum pressure.

Cover plate hinge base 56 rests on shim 54 and is fixedly secured to hinge 18' as shown. Cover plate hinge base 50 is also attached to cantilever bridge 58 as shown and supports cantilever bridge 56 and cover plate 14' when such are lifted away from base plate 12'.

Cantilever bridge 58 is attached to and supports cover plate 12' in a cantilever fashion and defines burr channel 40. Use of cantilever bridge 58 reduces hinge 50 manufacture costs relative to that of embodiment 10 since incorporation of burr channel 40 as shown in FIGS. 1 and 2 is more expensive. Cantilever bridge 58 can be attached to the top planar surface 31 of cover plate 12' and to the top planar surface 57 of cover plate hinge base 56 by conventional adhesives. Epoxy adhesives are recommended.

The use of cantilever bridge 58 allows hinge 50 to easily accommodate a variety of sheets 30 having differing thicknesses. Use of glass hinge bases 56 and 16' in cooperation with differing shims 52 and 54 ensure that the planar relationship between glass hinge 18', cover plate 14' and base plate 12' will be maintained independent of the thickness of sheet 30' without increasing the manufacturing costs associated with hinge 50.

Cover plate hinge base shim 54 can also serve as an alignment stopper (shown as stopper 20 in FIG. 1). When shim 54 is used as an alignment stopper it should be positioned so as to properly align sheet 30' between plates 12' and 14' while ensuring that burr 36' is within burr channel 34'. Use of additional alignment stoppers in addition to shim 54 is recommended when shim 54 may be insufficient to properly position sheet 30'.

A third alternative embodiment of the present invention is illustrated in FIGS. 5 and 6 and is referred to by general reference character 100. Components of FIGS. 5 and 6 similar to components of FIGS. 1 and 2 carry the same reference number distinguished by a double prime designation. Components of FIGS. 5 and 6 similar to components of FIGS. 3 and 4 carry the same reference number distinguished by a single prime designation.

In FIGS. 5 and 6 a non-segmented flexible hinge 18'' is used in conjunction with shims 52' and 54', cover plate hinge base 56', cantilever bridge 58' and alignment stoppers 20''.

In all embodiments base plate 12, cover plate 14, hinge base 16, hinge 18 and stoppers 20 should retain a predetermined registration when subjected to heating. In the second and third embodiments shims 52 and 54, cover plate hinge base 56 and cantilever bridge 58 are selected to have coefficients of expansion similar to that of base plate 12.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A photoetch plate hinge structure comprising:
   a glass photographic base plate having a support surface for supporting a sheet of material to be etched;
   a glass photographic cover plate overlapping said support surface for covering such sheet of material to be etched when said sheet of material is supported by the base plate, at least one of the plates having means for recording a preselected mask pattern thereon and opaque to a preselected radiation;
   a burr cavity about a planar surface of one of the plates, the burr cavity being disposed inward toward said sheet of material, to receive a raised edge portion of said sheet of material when said sheet of material is disposed between the cover plate and the base plate;
   a hinge base of a predetermined thickness, approximately equal to a combined thickness of said cover plate and said sheet of material, and fixedly attached to an upper surface of the base plate;
   a flexible unitary sheet hinge means having a first end portion attached to the hinge base and a second end portion attached to the cover plate so that the cover plate may be pivoted in an arc-like movement relative to the base plate, the hinge means having a coefficient of expansion comparable to that of the cover plate; and
   an alignment means, comprising at least one glass stopper having a coefficient of expansion similar to that of the base plate, and positioned about the base plate for aligning said sheet of material about the base plate so that said raised edge portions are within the burr cavity.

2. The structure of claim 1 wherein the preselected radiation is high intensity ultraviolet light.

3. The apparatus of claim 1 wherein
the base plate and the cover plate are rectangular, and the base plate is wider and longer than the cover plate.

4. The apparatus of claim 1 wherein
the coverplate includes a first section having a thickness equal to a thickness of the hinge platform, and a second section of a lesser thickness, said second section thickness being less than the thickness of said first section by an amount equal to a thickness of said sheet of material; and
said burr cavity is intermediate to said first section and said second section of the cover plate.

5. A photoetch plate hinge apparatus for use in photoetching sheet material comprising:
a photographic base plate having a support surface for supporting a sheet of material to be photoetched;
a cover photographic plate overlapping said support surface sheet of material when said sheet material is supported by the base plate, at least one of the plates having means for recording a preselected mask pattern thereon and opaque to preselected radiation, and the coefficient of expansion of the cover and base plates being the same;
a hinge base of a predetermined thickness fixedly attached to the base plate and having said coefficient of expansion;
a hinge shim of a predetermined thickness attached to the hinge platform and having said coefficient of expansion;
a cover plate hinge base shim of a predetermined thickness attached to the base plate and having said coefficient of expansion;
a cover plate hinge base of a predetermined thickness supported by, but not attached to, the cover plate hinge base shim;
a flexible hinge having one end portion fixedly attached to the hinge base and an opposite end portion fixedly attached to the cover plate hinge base, the hinge having said coefficient of expansion;
a cantilever bridge having one end portion attached to the cover plate hinge base and an opposite end portion attached to the cover plate to define a downwardly facing burr cavity such that raised edge portions of said sheet material are enclosed in said burr cavity when said sheet material is disposed between the cover plate and the base plate to prevent damage to either plate when said structure is subjected to vacuum pressure; and
an alignment means positioned about the base plate for aligning said sheet material about the base plate so that said raised edge portions are within said burr cavity.

6. The apparatus of claim 5 wherein
the hinge is metal, the cover and the base plates are glass, the cantilever bridge is glass, and the cover plate may be pivoted in an arc-like movement relative to the base plate.

7. The apparatus of claim 6 wherein
the alignment means includes at least one alignment stopper.

8. The apparatus of claim 6 wherein
the base hinge base shim is the same thickness as the cover photo etch plate hinge base shim.

9. The apparatus of claim 6 wherein
the cantilever bridge is attached to the cover plate hinge base and the cover plate by an epoxy adhesive.

10. The apparatus of claim 6 wherein
the base plate is rectangular, the cover plate is rectangular, and the base plate is wider and longer than the cover plate.

11. The apparatus of claim 6 wherein
the base plate and the cover plate are the same thickness.

12. The apparatus of claim 7 wherein
the alignment means is the cover plate hinge base shim, and the cover plate hinge base shim is the same thickness as the hinge base shim.

13. The apparatus of claim 5 wherein
the preselected radiation is a high intensity ultraviolet light.

* * * * *